(12) United States Patent
Christensen et al.

(10) Patent No.: US 10,178,798 B1
(45) Date of Patent: Jan. 8, 2019

(54) ELECTRONICS ENCLOSURE WITH AIRFLOW MANAGEMENT

(71) Applicant: Pure Storage, Inc., Mountain View, CA (US)

(72) Inventors: Erik Christensen, Mountain View, CA (US); Clay Ross, Mountain View, CA (US); Yifan Wang, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 0 days.

(21) Appl. No.: 15/421,234

(22) Filed: Jan. 31, 2017

Related U.S. Application Data

(60) Provisional application No. 62/426,133, filed on Nov. 23, 2016.

(51) Int. Cl.
| | |
|---|---|
| *H05K 7/20* | (2006.01) |
| *G06F 1/20* | (2006.01) |
| *H01L 23/467* | (2006.01) |
| *H05K 9/00* | (2006.01) |

(52) U.S. Cl.
CPC ....... *H05K 7/2019* (2013.01); *H05K 7/20145* (2013.01); *H05K 7/20172* (2013.01); *H05K 9/0009* (2013.01); *G06F 1/20* (2013.01); *H01L 23/467* (2013.01)

(58) Field of Classification Search
CPC ......... H01L 23/467; G06F 1/20; G06F 1/206; H05K 7/20145; H05K 7/20172; H05K 7/20727; H05K 7/20736; H05K 1/0203; H05K 5/03; H05K 7/20163; H05K 7/2049; H05K 7/20136; H05K 7/20154; H05K 7/20972; H05K 7/20581; H05K 7/2019; H05K 9/0009

See application file for complete search history.

(56) References Cited

U.S. PATENT DOCUMENTS

| | | | | |
|---|---|---|---|---|
| 5,813,243 | A * | 9/1998 | Johnson | G06F 1/20 361/678 |
| 6,373,696 | B1 * | 4/2002 | Bolognia | G06F 1/184 361/679.33 |
| 6,563,706 | B1 * | 5/2003 | Strickler | H05K 7/20718 165/122 |
| 8,929,024 | B1 * | 1/2015 | Sorenson, III | G11B 25/043 360/97.13 |
| 9,398,720 | B1 * | 7/2016 | Frank | H05K 7/20563 |

(Continued)

*Primary Examiner* — Adam B Dravininkas

(74) *Attorney, Agent, or Firm* — Womble Bond Dickinson (US) LLP

(57) ABSTRACT

A housing having a first chamber arranged to receive one or more enclosures, and having a second chamber separated from the first chamber by a wall is provided. The one or more enclosures are each arranged to have electronic circuitry within the enclosure. The housing has one or more fans arranged to exhaust a first airflow from each of the one or more enclosures and the first chamber. The housing has one or more power supplies with a further one or more fans arranged to exhaust a second airflow from the second chamber and the one or more power supplies. The wall has one or more apertures arranged to at least partially align with one or more apertures of each of the one or more enclosures, so that the second airflow proceeds through the one or more apertures of the wall.

14 Claims, 8 Drawing Sheets

(56) References Cited

U.S. PATENT DOCUMENTS

| | | | | |
|---|---|---|---|---|
| 9,807,911 B1* | 10/2017 | Bryan | ............ | G06F 1/20 |
| 2004/0008484 A1* | 1/2004 | Konshak | ............ | G06F 1/184 |
| | | | | 361/679.5 |
| 2007/0253157 A1* | 11/2007 | Atkins | ............ | G06F 1/184 |
| | | | | 361/679.33 |
| 2008/0101020 A1* | 5/2008 | Curtis | ............ | G06F 1/20 |
| | | | | 361/695 |
| 2008/0218949 A1* | 9/2008 | Hughes | ............ | G11B 33/125 |
| | | | | 361/678 |
| 2009/0103414 A1* | 4/2009 | Joshi | ............ | G11B 33/142 |
| | | | | 369/75.11 |
| 2009/0135558 A1* | 5/2009 | Hughes | ............ | H05K 7/20727 |
| | | | | 361/679.46 |
| 2012/0069514 A1* | 3/2012 | Ross | ............ | H05K 7/20727 |
| | | | | 361/679.33 |
| 2012/0243170 A1* | 9/2012 | Frink | ............ | G06F 1/187 |
| | | | | 361/679.34 |
| 2012/0243172 A1* | 9/2012 | Ross | ............ | G06F 1/187 |
| | | | | 361/679.37 |

\* cited by examiner

ELECTRONICS ENCLOSURE WITH AIRFLOW MANAGEMENT

BACKGROUND

Traditionally, electronics components are air cooled, often in an enclosure with one or more intake or exhaust fans. Careful design in a fault-tolerant environment suggests there should be more than one fan, in case one fan fails. Modular electronics components introduce additional factors, in that the cooling of the system should be effective whether there is one or many components installed. Some of the components may generate more heat than others. A standard airflow with one pathway and one cooling fan may not suffice for all conditions of operation. Sometimes a component or member obstructs an air passage, reducing air cooling efficiency, especially in a compact and dense configuration. It is within this context that the embodiments arise.

SUMMARY

In some embodiments, an electronics housing is provided. The housing includes a first enclosure, having a first chamber arranged to receive one or more second enclosures, and having a second chamber separated from the first chamber by a wall. The one or more second enclosures are each arranged to have electronic circuitry within the second enclosure. The first enclosure has one or more fans arranged to exhaust a first airflow from each of the one or more second enclosures and the first chamber. The first enclosure has one or more power supplies with a further one or more fans arranged to exhaust a second airflow from the second chamber and the one or more power supplies. The wall has one or more apertures arranged to at least partially align with one or more apertures of each of the one or more second enclosures, the second airflow proceeding through the one or more apertures of the wall.

In some embodiments, an electronics housing is provided. The housing includes a first enclosure having a first chamber and one or more exhaust fans arranged to support a first airflow through the first chamber and the one or more exhaust fans. The housing includes one or more second enclosures dimensioned to fit in the first chamber and dimensioned to receive electronic circuitry, with the first airflow cooling the electronic circuitry. The first enclosure has a second chamber with a wall in common between the first chamber and the second chamber. The first enclosure has one or more power supplies with a further one or more exhaust fans arranged to support a second airflow through the second chamber and the one or more power supplies. The wall has one or more apertures at least partially aligned with one or more apertures of each of the one or more second enclosures and the second airflow proceeding through the one or more at least partially aligned apertures.

In some embodiments, a method of operating an electronics housing is provided. The method includes directing a first airflow through a second enclosure in a first chamber of a first enclosure, past electronic circuitry in the second enclosure, and through a plurality of exhaust fans of the first enclosure. The method includes directing a second airflow through a second chamber of the first enclosure, through one or more power supplies in the second chamber, and through a further plurality of exhaust fans of the one or more power supplies. The second airflow proceeds through one or more apertures of the one or more second enclosures at least partially aligned with one or more apertures of a wall separating the first chamber from the second chamber and into the second chamber.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

An electronics enclosure described herein has airflow management to cool various components. One set of fans exhausts air from one chamber of an electronics chassis, cooling electronics boards in enclosures inserted into the chamber. Another set of fans exhausts air from power supplies, and from another chamber of the electronics chassis. Apertures in the enclosures of the electronics boards align or partially align with apertures in a wall separating the two chambers of the electronics chassis and direct an airflow from the enclosures of the electronics boards through the aligned/partially aligned slots, to exhaust through the fans of the power supplies. These aligned/partially aligned apertures provide additional airflow to both the electronics boards and the power supplies, for cooling in a densely packed chassis or enclosure.

Various embodiments of the electronics enclosure are made of metal or another suitable component or composition, with dimensions, spacings and placement of apertures and walls designed for reduction in electromagnetic interference (EMI). One embodiment of the electronics enclosure is a chassis for blades of a storage system, and each blade has one or more processors and a large amount of solid-state storage memory, all of which generate heat during operation. The chassis/enclosure may be configured to be rack mounted in some embodiments. Airflow management in the electronics chassis is directed to remove this generated heat while not compromising EMI reduction goals for the chassis.

Figure 1:
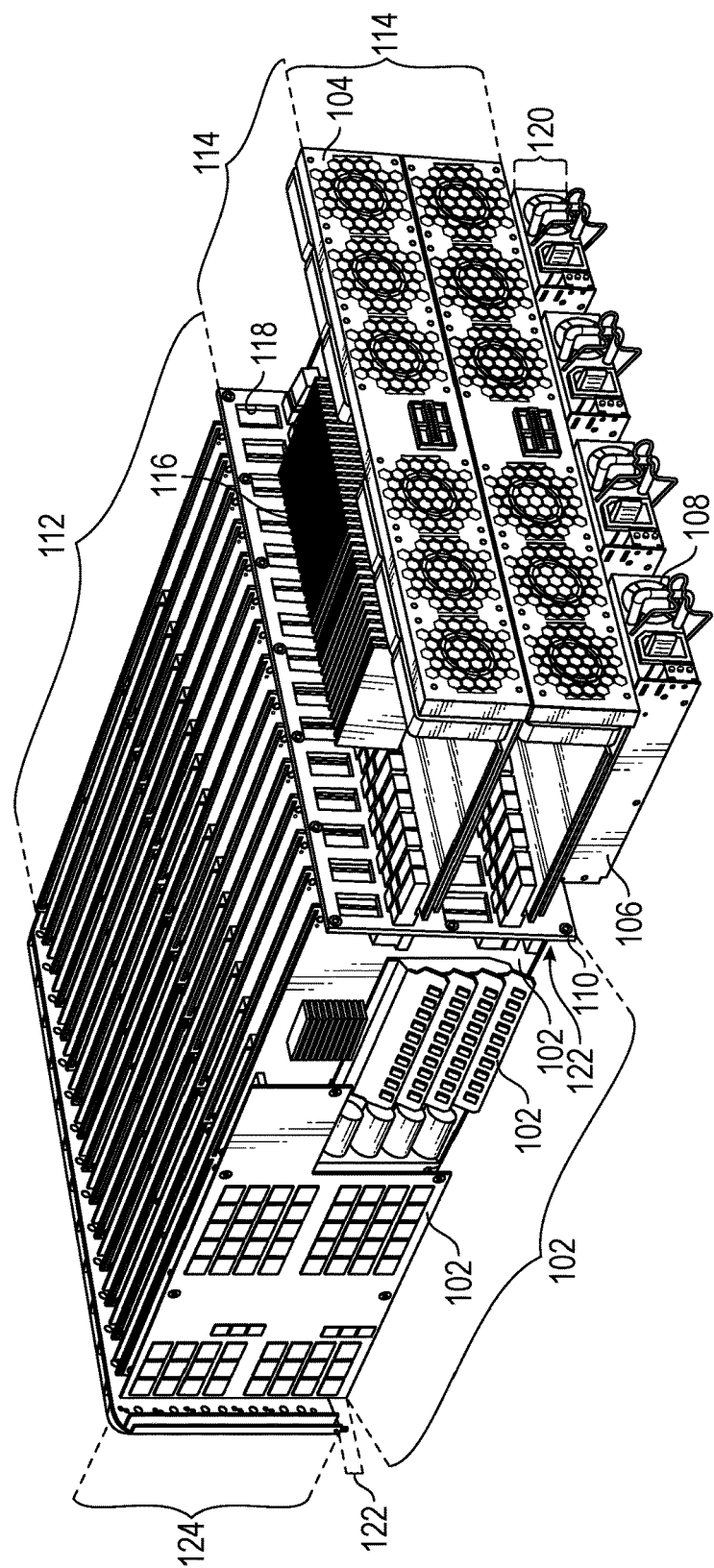
FIG. 1 is a perspective view of the interior contents of an electronics chassis, with electronics boards, exhaust fans, and power supplies with further exhaust fans.

FIG. 1 is a perspective view of the interior contents of an electronics chassis, with electronics boards 102, exhaust fans 104, and power supplies 106 with further exhaust fans 108. This is one example of electronics content, and the electronics enclosures and chassis described herein is suitable for many variations of what is illustrated in FIG. 1. Printed circuit boards with various electronic components, in various arrangements, including multiple printed circuit boards and various connectors, mounted at various angles, etc., are all possible candidates for inclusion in an electronics chassis. The electronics chassis is a housing for electronics that provides both air cooling and EMI reduction as further described below.

In the embodiment shown, the electronics boards 102 are mounted vertically, i.e., along an elongated edges of the electronic board, and can be inserted to or removed from insertion slots in a chassis, for example as blades in a storage system. As illustrated below, electronics boards 102 may be contained within a housing or enclosure. The electronics boards 102 are in a first chamber 124 in an electronics chassis, which is further described below with reference to FIGS. 3-6. A mid-plane 110 separates the region 112 with insertion slots for the electronics boards 102 from another region 114, which contains switching fabric 116 in one embodiment, but could contain other electronics or be empty, in further embodiments, or even absent altogether. Exhaust fans 104 are mounted at the end of the chassis, and pull a first airflow through the first chamber, cooling the electronics boards 102. The first airflow also goes through apertures 118 in the midplane 110 and through the region 114 to cool the switching fabric 116. This first airflow exits the electronics chassis through the exhaust fans 104 of the chassis.

Power supplies 106 are positioned below the region 114 with the switching fabric 116, in a region 120 in a second chamber 122 of the chassis. Exhaust fans 108 of the power supplies 106 pull a second airflow through the second chamber 122 and through the power supplies 106, to cool the power supplies 106. This second airflow exits the electronics chassis through the exhaust fans 108 of the power supplies 106.

In some embodiments, the exhaust fans 104 and/or the exhaust fans 108 of the power supplies 106 have controllable variable speeds and/or can be switched on and off, for example under control of a power supply management circuit or processor. Some embodiments have temperature monitoring with sensors to control the exhaust fans 104, 108. A fault-tolerant version allows switching exhaust fans 104, 108 on and off or controlling variable speeds so as to compensate for a failed fan, e.g., as detected directly or as inferred by temperature monitoring.

Figure 2:
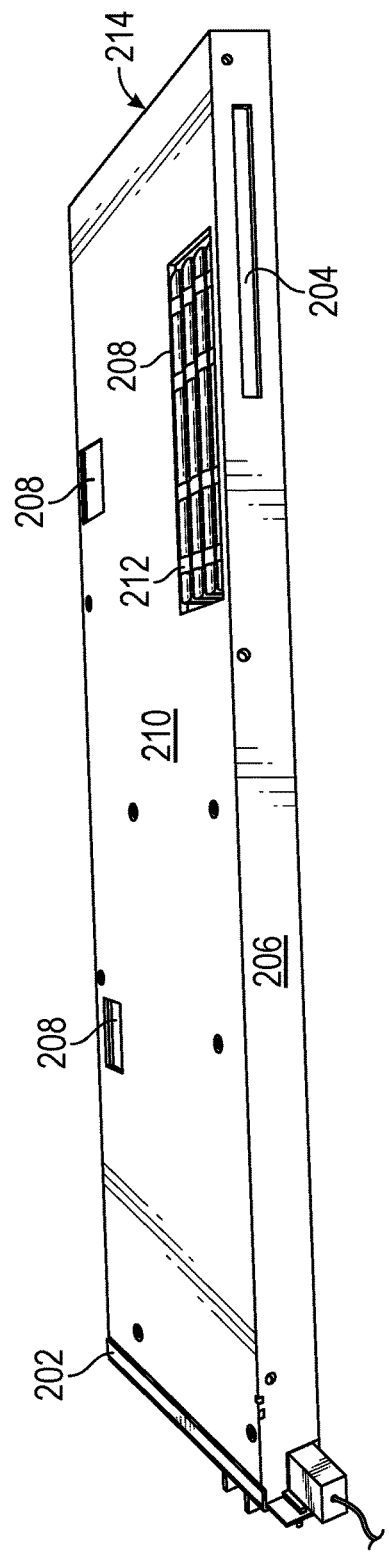
FIG. 2 is a perspective view of an enclosure for one or more of the electronics boards, for example as a blade, showing an aperture for airflow management.

FIG. 2 is a perspective view of an enclosure 202 for one or more of the electronics boards 102, for example as a blade, showing an aperture 204 for airflow management. The enclosure 202 is made of metal, for example sheet aluminum in one embodiment, to reduce electromagnetic interference (EMI). This is not meant to be limiting as the enclosure 202 may be composed of any suitable material. Along a bottom edge or face 206 of the enclosure 202, the aperture 204 is placed to direct airflow out of the enclosure 202 as further described below with reference to FIG. 3. Further apertures 208 are located on a side wall 210 or face of the enclosure 202 to allow inspection, e.g., of memory components 212 or board identification numbers, etc. and/or to allow airflow into or out of the enclosure 202. One end 214 of the enclosure 202 is open or at least partially open with one or more apertures that direct the first airflow out of the enclosure 202 towards the exhaust fans 104 of the chassis. In some embodiments, the aperture 204 is closer to or at the same end 214 of the enclosure 202 that is open or has apertures to direct the first airflow out, so that the airflow that diverges or diverts from the first airflow and exits the enclosure 202 through the aperture 204 is exiting adjacent to where the first airflow exits the enclosure 202.

Figure 3A:
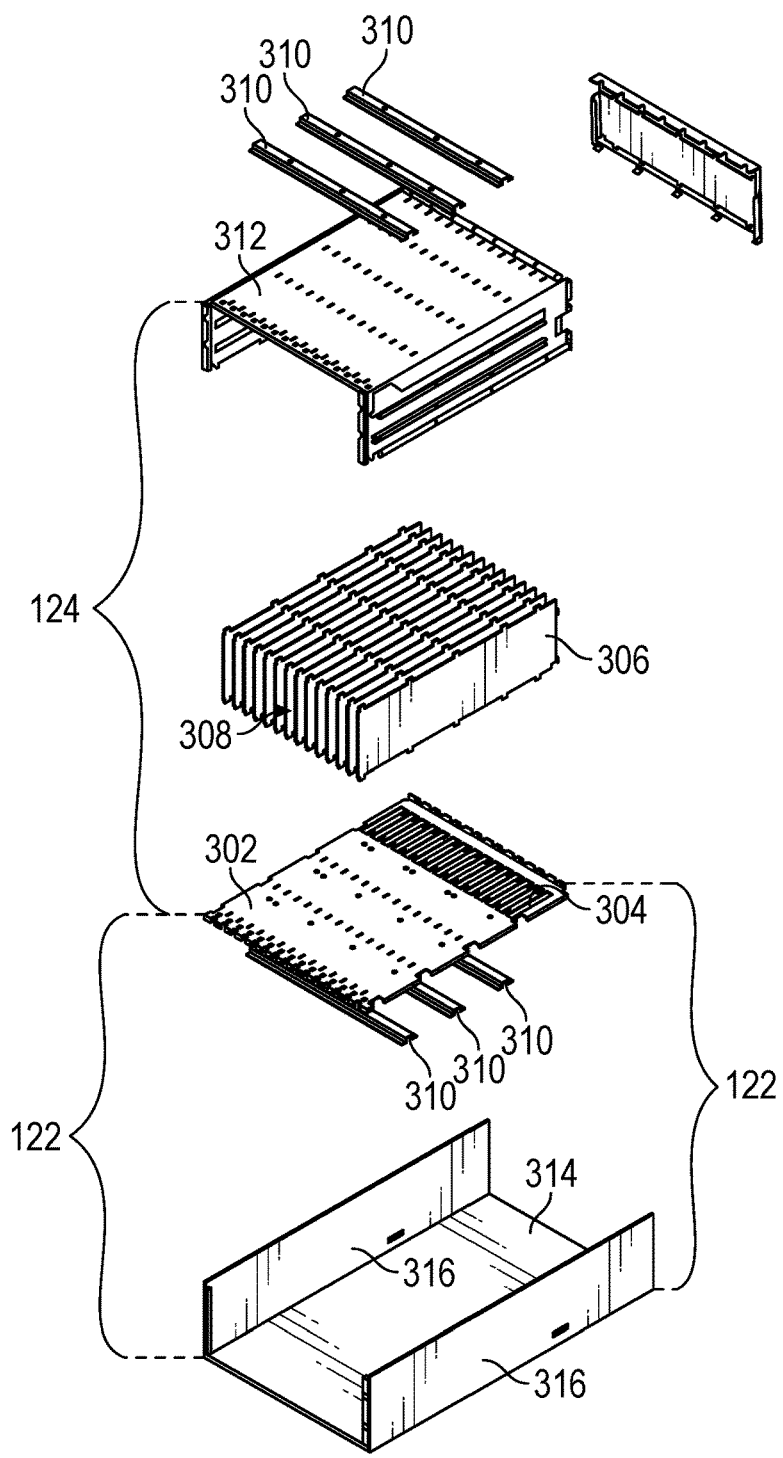
FIG. 3A is an exploded view of part of an electronics chassis suitable for enclosing the interior contents shown in FIGS. 1 and 2, showing a wall with apertures for airflow management, and divider walls for partitioning a chamber into insertion slots for the enclosures and electronics boards.

FIG. 3A is an exploded view of part of an electronics chassis suitable for enclosing the interior contents shown in FIGS. 1 and 2, showing a wall 302 with apertures 304 for airflow management, and divider walls 306 for partitioning a chamber 124 into insertion slots 308 for the enclosures 202 and electronics boards 102. Divider walls 306 add rigidity and support to the chassis. In some embodiments, each insertion slot 308 can receive and accommodate one of the enclosures 202, with one or more electronics boards 102 inside the enclosure 202. Cross members 310 physically support and stiffen the chamber separation wall 302. Further cross members 310 provide rigidity to a ceiling panel 312 of the chassis. In some embodiments, the divider walls 306 (or partitioning walls), the chamber separation wall 302, cross members 310, ceiling panel 312, floor panel 314, chassis sidewalls 316, etc., are made of metal, for example aluminum, to reduce EMI. It should be appreciated that the components may be made of any suitable material or combination of materials and are not limited to metal materials.

It is common in electronics assemblies and housings, including enclosures and chassis, to enclose electronics circuits in a metal box for EMI reduction. However, EMI can leak out through various apertures, gaps, etc., of an enclosure, which can be problematic. A first technique of EMI reduction employed herein is to have each divider wall 306 be unbroken by apertures, i.e., be a single monolithic sheet without openings or gaps, so that the divider wall 306 acts as a closely spaced cover plate over any inspection apertures 208 in the enclosure 202 of the electronics boards 102. A second technique of EMI reduction employed herein is to have each divider wall 306 spaced closely to the nearest wall of the enclosure 202. With this arrangement, the divider wall 306 and the wall of the enclosure 202 (when the enclosure 202 is inserted into an insertion slot of the first chamber 124 of the chassis) form a waveguide that supports (i.e., passes efficiently) only much higher frequencies than emitted by the electronics boards 102. The waveguide suppresses the fundamental frequency electromagnetic radiation from the electronics boards 102. For example, in one embodiment, the electronics boards 102 operate at 10 GHz, and the spacing between divider wall 306 and wall of the enclosure 202 is of the order of one half a millimeter, forming a waveguide that passes 600 GHz but suppresses (or does not pass efficiently) 10 GHz electromagnetic radiation. It should be appreciated that alternative spacing may be utilized and still keep within the spirit of the embodiments.

Figure 3B:
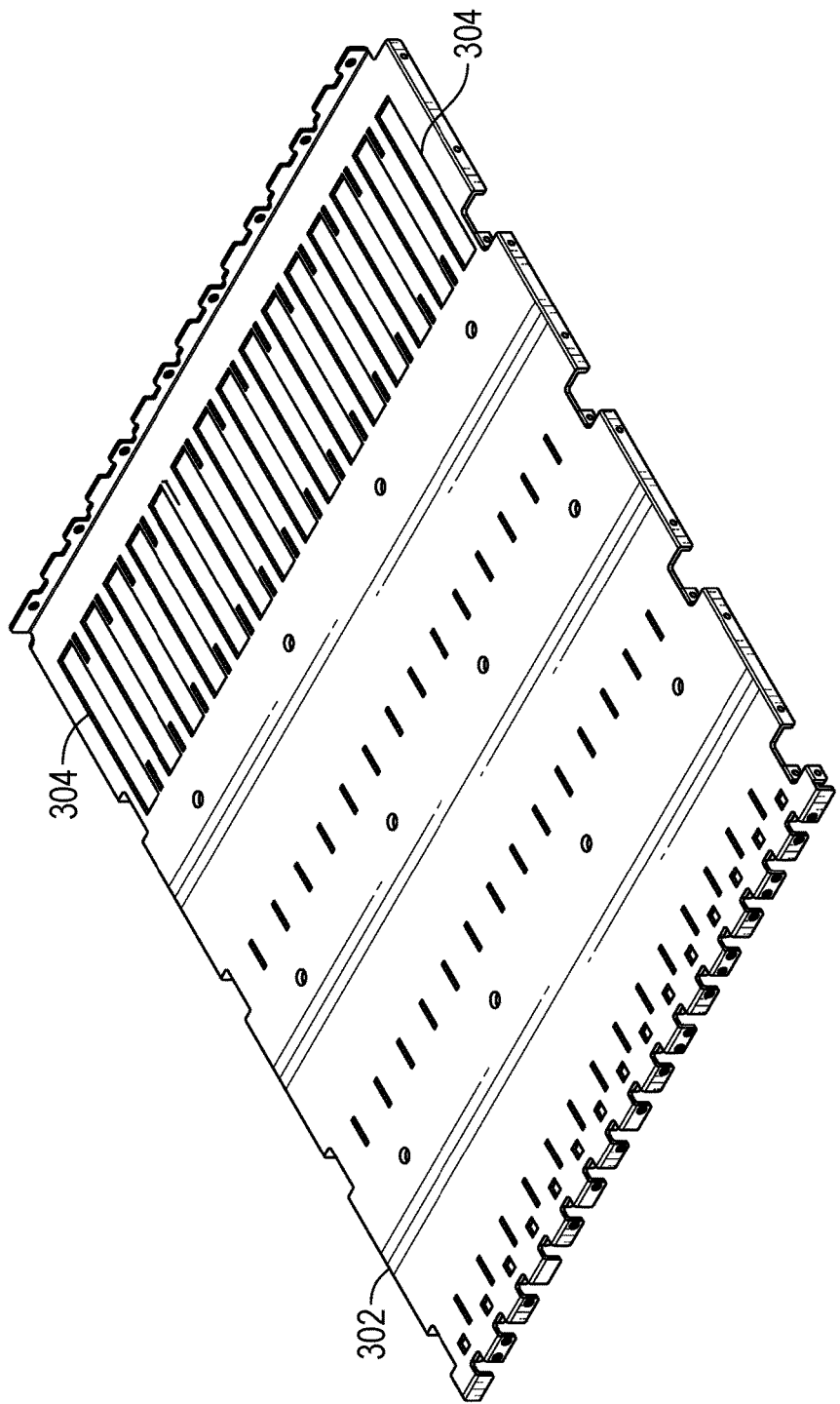
FIG. 3B is an enlarged perspective view of the chamber separation wall of FIG. 3A.

FIG. 3B is an enlarged perspective view of the chamber separation wall 302 of FIG. 3A. Each aperture 304 of the chamber separation wall 302 aligns (at least partially) with the aperture 204 of one of the enclosures 202 for the electronics boards 102 (see FIG. 2), although further embodiments could have more than one aperture 304, 204 in one or both of these components. Also seen on the chamber separation wall 302 are various apertures and/or protrusions for attaching and aligning divider walls 306 and/or guide rails, etc.

Figure 4:
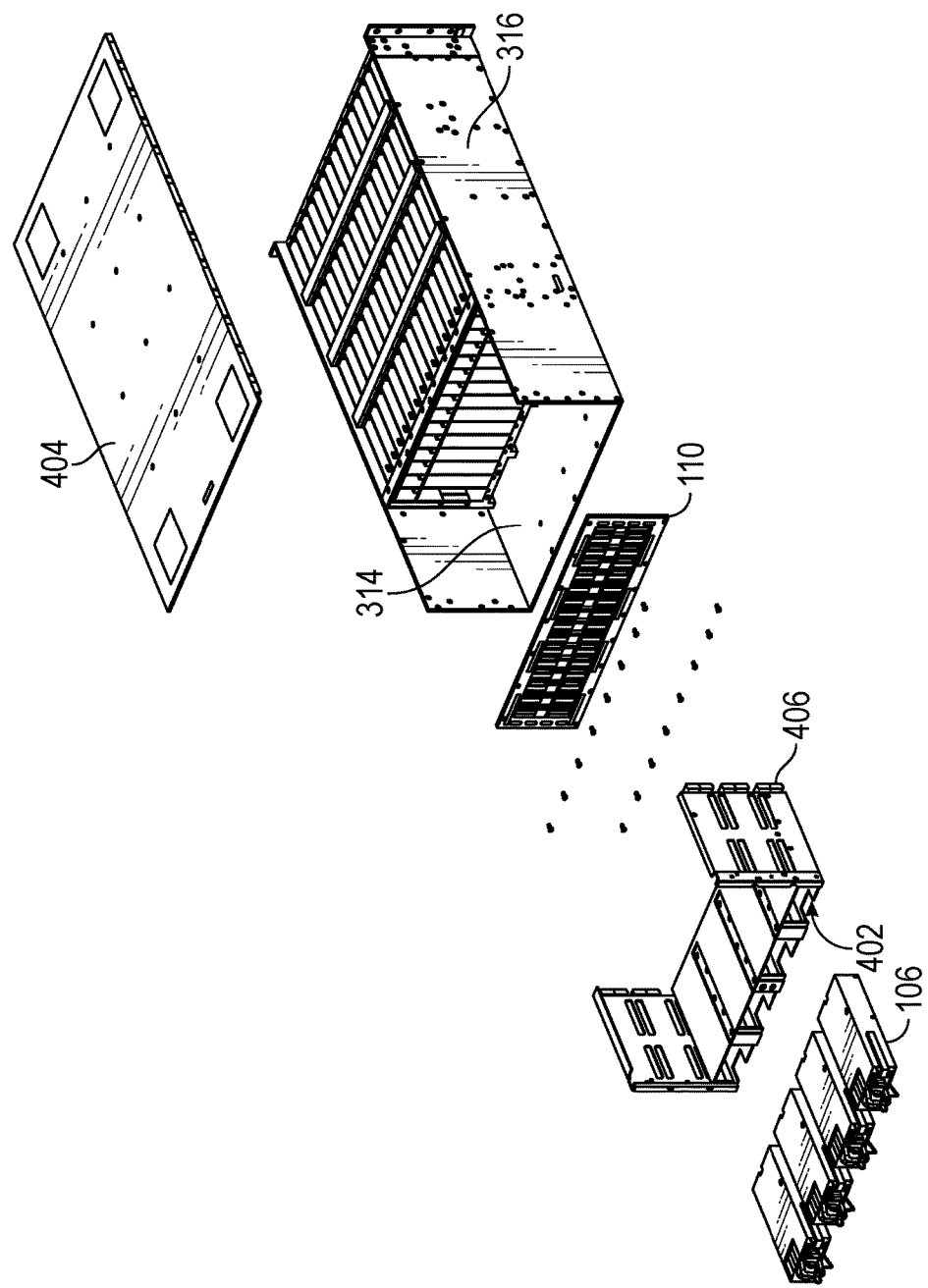
FIG. 4 is an exploded view of the electronics chassis, showing a midplane and placement of the power supplies in power supply bays.

FIG. 4 is an exploded view of the electronics chassis, showing a mid-plane 110 and placement of the power supplies 106 in power supply bays 402. The chassis is rotated 180° about a vertical axis from the depiction in FIG. 3A, to the depiction in FIG. 4. Arranged inside the chassis, the mid-plane 110 is perpendicular to and at one end of the chamber separation wall 302. A top cover 404, also made of metal or any suitable material, is located immediately above the insertion slots 308 and divider walls 306 of the chassis. An end-bay assembly 406, defining the power supply bays 402 and locators for the switch fabric 116 (or other electronics in further embodiments) is assembled to the chassis, for example by attaching to the chassis sidewalls 316 and floor panel 314. The chassis may be rack mountable in some embodiments.

Figure 5:
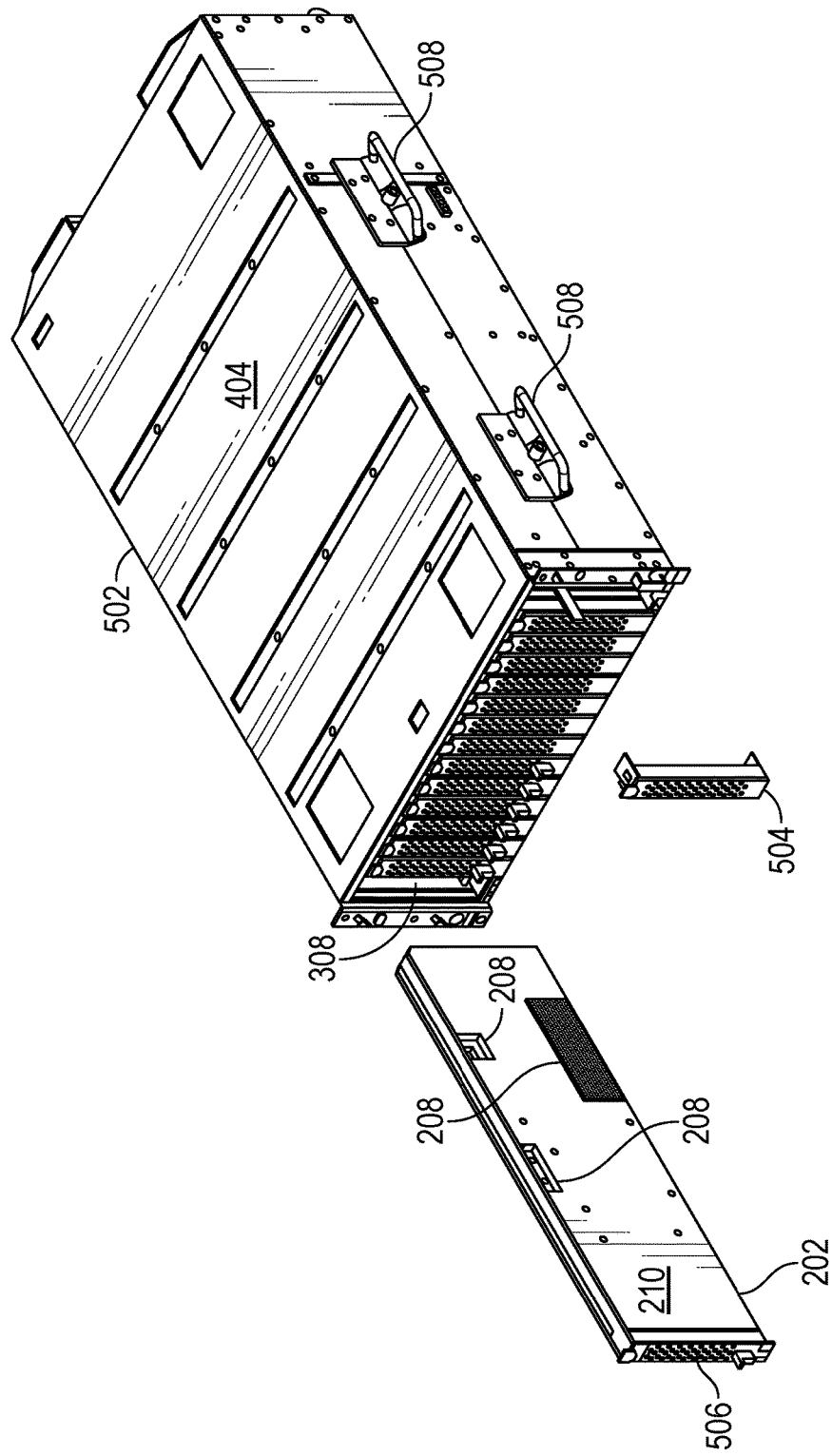
FIG. 5 is a perspective view of the electronics chassis, with the enclosure and electronics of FIG. 2 ready to be inserted into an insertion slot of the chassis, and a dummy faceplate.

FIG. 5 is a perspective view of the electronics chassis 502, with the enclosure 202 and electronics of FIG. 2 ready to be inserted into an insertion slot 308 of the chassis 502, and a dummy faceplate 504. Orientation of the chassis 502 in FIG. 5 is similar to that of FIG. 3A. The dummy faceplate 504 is similar to or identical to a faceplate 506 of the enclosure 202, in some embodiments. Both faceplates 504, 506 have perforation to allow incoming airflow into the enclosure(s) 210 in both occupied and unoccupied insertion slots 308 of the chassis 502. In some embodiments, the perforations of faceplates 504, 506, along with the divider walls 306, are configured to provide approximately equal airflow through each slot 308, so that an occupied slot 308 (i.e., with an enclosure 202 and electronics, or blade in some embodiments) does not get starved of cooling airflow as might occur if no dummy faceplates 504 and divider walls 308 were present. Some versions of the chassis 502 have handles 508 for portability, although these are not necessary for airflow, EMI reduction or operation of the electronics.

Figure 6:
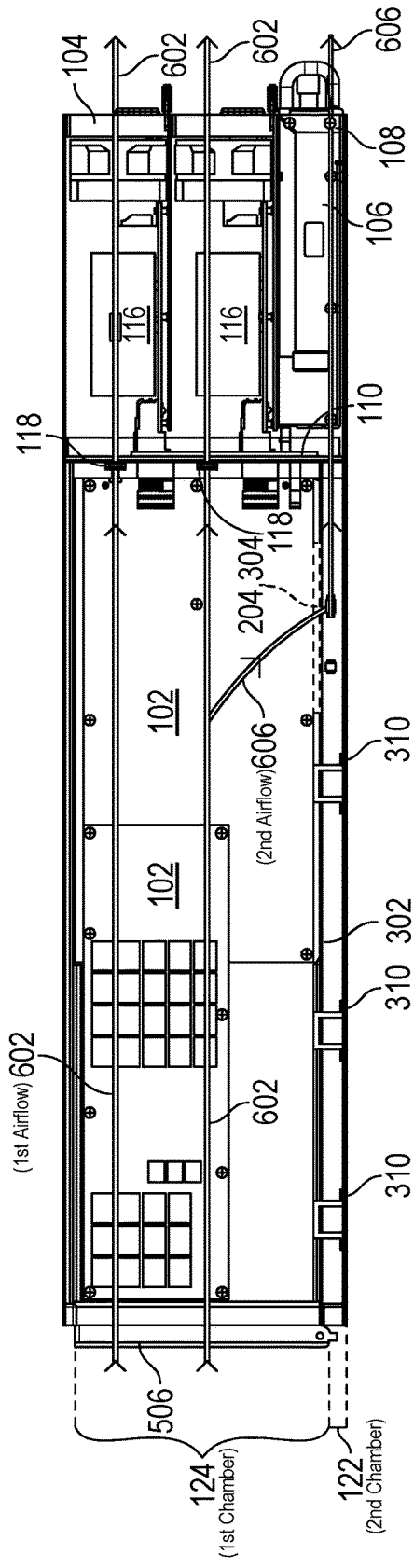
FIG. 6 is a cross-section view of the electronics chassis of FIGS. 1-4, showing effects of an aperture that directs an airflow from one chamber of the chassis to another chamber of the chassis, improving cooling of electronics components.

FIG. 6 is a cross-section view of the electronics chassis 502 of FIGS. 1-5, showing effects of at least partially aligned apertures 204, 304 that direct an airflow 606 from one chamber 124 of the chassis 502 to another chamber 122 of the chassis 502, improving cooling of electronics components. In this example, the electronics boards 102 in the second enclosure 202, e.g., a blade, are for a storage system and shown as a flash memory card, and a CPU (central processing unit) card. The second enclosure 202 is inserted into an insertion slot 308 and is in the first chamber 124 of the chassis 502, above the chamber separation wall 302. Cross members 310, oriented perpendicularly to the drawing page, span the width of the chassis 502 and support the chamber separation wall 302 from beneath the chamber separation wall 302, partially (or in some embodiments fully) obstructing a portion of the second chamber 124 of the chassis 502.

Continuing with FIGS. 5 and 6, a first airflow 602 flows in through a faceplate 506 of the second enclosure 202, past the electronics boards 102, through an aperture 118 in the mid-plane 110, past further electronics (e.g., switch fabric 116), through the exhaust fan(s) 104 and out of the chassis 502. This first airflow 602 flows through the first chamber 124 of the chassis 502, above the chamber separation wall 302, and is depicted in an upper path (upper part of the drawing) in FIG. 6, and a middle path (middle of the drawing). A second airflow 606 flows in through a gap below the faceplate 506, or in some embodiments through the lower part of the faceplate 506, through the second chamber 122 of the chassis 502, below the chamber separation wall 302, then under the mid-plane 110, through the power supply or power supplies 106, through the exhaust fan(s) 108 of the power supply or power supplies 106 and out of the chassis 502. In some embodiments, the second airflow 606 could flow through a further aperture(s) in the mid-plane 110, instead of or in addition to flowing beneath the mid-plane 110. In addition, the second airflow may proceed through an opening in the chassis that is not blocked by any cross members 310.

Still referring to FIGS. 5 and 6, a second airflow 606 diverges from the first airflow 602 and flows through the at least partially aligned apertures 204, 304 of the second enclosure 202 and the chamber separation wall 302 and continues through power supplies 106. From then on, airflow 606 passes underneath the midplane 110 (or through a further aperture(s) in the mid-plane 110 as mentioned above) and out through the power supply or power supplies 106 and exhaust fan(s) 108 of the power supply or power supplies 106 as described above. The apertures 204, 304 of the second enclosure 202 and the chamber separation wall 302 enable the second airflow 606 to avoid the cross members 310, where present in embodiments. For example, the aperture 204 of the second enclosure 202 and the aperture 304 of the chamber separation wall 302 may be positioned closer to the power supplies 106 than the crossmember(s) 310 or other structure blocking airflow in the second chamber 122. In embodiments where the crossmembers 310 or other member(s) completely obstruct the second chamber 122 and prevent airflow from the faceplate 506 or front of the chassis 502 into the second chamber 102, apertures 204, 304 enable the flow from the first chamber to the second chamber.

Figure 7:
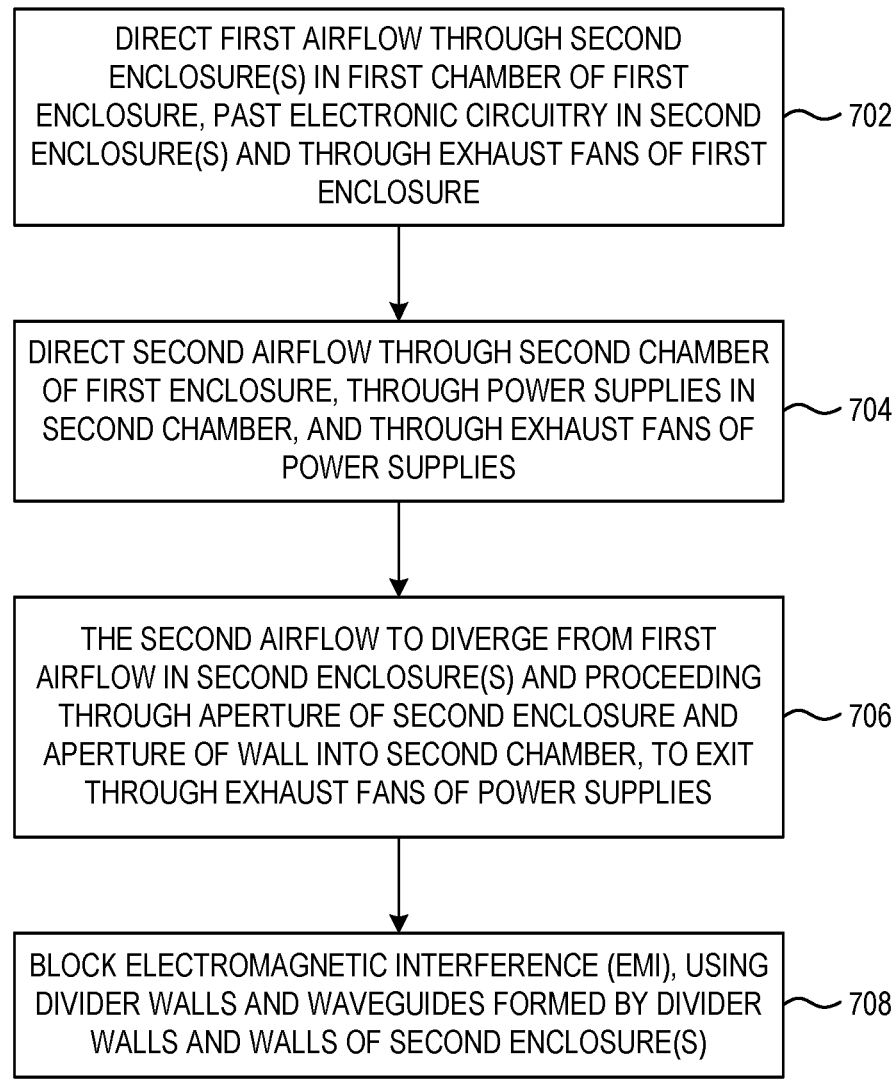
FIG. 7 is a flow diagram of a method for managing airflow for an electronics enclosure, which can be practiced on or by the electronics chassis and contents shown in FIGS. 1-6.

FIG. 7 is a flow diagram of a method for managing airflow for an electronics enclosure, which can be practiced on or by the electronics chassis and contents shown in FIGS. 1-6. Various surfaces, apertures and fans of the electronics enclosure direct the airflows, as follows. The method is executed through one or more controllers, which may be within the chassis. For example, the exhaust fans and the power supply fans may have respective controllers that execute portions of the method. In some embodiments a single controller may provide the control methodology for each of the multiple airflows. In an action 702, a first airflow is directed through second enclosure(s) in a first chamber of a first enclosure, past electronic circuitry in the second enclosure(s), and through exhaust fans of the first enclosure. The first airflow thus cools the electronic circuitry in the second enclosure(s), and may cool additional electronic circuitry elsewhere in the electronics chassis. In one embodiment, the first chamber is above a chamber separation wall of the electronics chassis. In some embodiments, the first chamber is subdivided into insertion slots, by divider walls in the first chamber. In an action 704, a second airflow is directed through a second chamber of the first enclosure, through the power supplies in the second chamber, and through exhaust fans of the power supplies. The second airflow thus cools the power supplies. In one embodiment, the second chamber is below the chamber separation wall of the electronics chassis. In some embodiments, there may be only one power supply and/or one exhaust fan of the power supply or power supplies.

Still referring to FIG. 7, in an action 706, a second airflow is directed to diverge from the first airflow in the second enclosure(s) and pass through an aperture(s) of the second enclosure and an aperture(s) of a wall (e.g., the chamber separation wall) into the second chamber, to exit through exhaust fans of the power supplies. The apertures could be completely aligned, or have only partial alignment. In some embodiments, the apertures direct the second airflow to avoid cross members or other obstructions to airflow in the second chamber. The second airflow provides additional cooling for the electronics in the second enclosure(s) and the power supplies. In an action 708, electromagnetic interference is blocked, using divider walls and waveguides formed by the divider walls and walls of the second enclosure(s). In some embodiments, the divider walls are larger than inspection apertures in the second enclosure(s) and thus serve to block EMI. In some embodiments, the divider walls are spaced closely to the walls of the second enclosure(s) so as to form one or more waveguides that suppress electromagnetic radiation at the fundamental frequency and wavelength of the electronic circuitry in the second enclosure(s).

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry or mechanical features) that performs the task or tasks during operation. As such, the unit/circuit/component can be said to be configured to perform the task even when the specified unit/circuit/component is not currently operational (e.g., is not on). The units/circuits/components used with the "configured to" language include hardware--for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits or manufactured articles) that are adapted to implement or perform one or more tasks, or designing an article or apparatus to have certain features or capabilities.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An electronics housing, comprising:
   A housing, having a first chamber arranged to receive one or more enclosures, the housing having a second chamber separated from the first chamber by a wall;
   the one or more enclosures, each arranged to have electronic circuitry within the one or more second enclosure;
   the housing having one or more fans arranged to exhaust a first airflow from each of the one or more enclosures and the first chamber;
   the housing having one or more power supplies with a further one or more fans arranged to exhaust a second airflow from the second chamber and the one or more power supplies; and
   the wall having one or more apertures arranged to at least partially align with one or more apertures of each of the one or more enclosures, the second airflow proceeding through the one or more apertures of the wall.

2. The electronics housing of claim 1, wherein the second airflow diverges from the first airflow at the one or more apertures of each of the one or more enclosures.

3. The electronics housing of claim 1, further comprising:
   a plurality of divider walls, arranged to subdivide the first chamber into a plurality of insertion slots each dimensioned to receive one of the enclosures with a wall of the enclosure spaced apart from one of the plurality of divider walls by a distance small enough that the wall of the enclosure and the one of the plurality of divider walls forms a waveguide and suppresses electromagnetic interference (EMI) of the electronic circuitry.

4. The electronics housing of claim 1, further comprising:
one or more cross members supporting or stiffening the wall and at least partially blocking a portion of the second chamber; and
the one or more apertures of the wall positioned more proximate to the one or more power supplies than the one or more cross members.

5. The electronics housing of claim 1, further comprising:
a mid-plane arranged inside the housing, perpendicular to and at one end of the wall, and having one or more apertures arranged so that the first airflow flows through the one or more apertures of the mid-plane to the one or more fans.

6. The electronics housing of claim 1, further comprising:
each of the one or more enclosures having one or more further apertures for inspection of the electronic circuitry; and
a plurality of divider walls subdividing the first chamber into a plurality of insertion slots and arranged to block or reduce electromagnetic interference (EMI) from the one or more further apertures of each of the one or more enclosures.

7. The electronics housing of claim 1, further comprising:
the one or more apertures of each of the one or more enclosures positioned at an end of the one or more second enclosures proximate to the one or more power supplies, so that the second airflow exits the one or more enclosures proximate to the first airflow exiting the one or more enclosures.

8. An electronics housing, comprising:
a housing having a first chamber and one or more exhaust fans arranged to support a first airflow through the first chamber and the one or more exhaust fans;
one or more enclosures dimensioned to fit in the first chamber and dimensioned to receive electronic circuitry, with the first airflow cooling the electronic circuitry;
the housing further having second chamber with a wall in common between the first chamber and the second chamber;
the housing having one or more power supplies with a further one or more exhaust fans arranged to support a second airflow through the second chamber and the one or more power supplies; and
the wall having one or more apertures at least partially aligned with one or more apertures of each of the one or more enclosures, the second airflow proceeding through the one or more at least partially aligned apertures.

9. The electronics housing of claim 8, wherein the second airflow travels through each of the one or more enclosures with the first airflow, and diverges from the first airflow at the one or more apertures of each of the one or more enclosures.

10. The electronics housing of claim 8, further comprising:
the first chamber subdivided into a plurality of insertion slots by a plurality of divider walls, each insertion slot dimensioned to receive one of the enclosures and suppress electromagnetic interference (EMI) of the electronic circuitry as a result of forming a waveguide bounded by one of the plurality of divider walls and a wall of the insertion slot.

11. The electronics housing of claim 8, further comprising:
at least one cross member mounted below the wall to support the wall and at least partially obstruct the second chamber; and
the one or more apertures of the wall located so that the at least one cross member does not obstruct the second airflow.

12. The electronics housing of claim 8, further comprising:
the housing having a mid-plane with one or more apertures arranged to have the first airflow flow through the one or more apertures of the mid-plane and flow to the one or more fans.

13. The electronics housing of claim 8, further comprising:
one or more further apertures in each of the one or more enclosures, for inspection or ventilation; and
the first chamber having a plurality of divider walls each arranged to block or reduce electromagnetic interference (EMI) from the one or more further apertures of each of the one or more enclosures, the plurality of divider walls forming insertion slots for the one or more enclosures.

14. The electronics housing of claim 8, further comprising:
each of the one or more enclosures having the one or more apertures located at an end of the enclosure for exit of the second airflow from the enclosure proximate to exit of the first airflow from the enclosure.

* * * * *